(12) United States Patent
Herb

(10) Patent No.: US 6,931,918 B2
(45) Date of Patent: Aug. 23, 2005

(54) DEVICE AND METHOD FOR DETERMINING THE ROTARY ORIENTATION OF A MOTOR THROUGH USE OF A RESOLVER SIGNAL DERIVED FROM THE ROTARY ORIENTATION

(75) Inventor: Robert Herb, Offenbach (DE)

(73) Assignee: Siemens Aktiengesellschaft, Munich (DE)

( * ) Notice: Subject to any disclaimer, the term of this patent is extended or adjusted under 35 U.S.C. 154(b) by 47 days.

(21) Appl. No.: 10/353,098

(22) Filed: Jan. 29, 2003

(65) Prior Publication Data

US 2003/0172727 A1 Sep. 18, 2003

(30) Foreign Application Priority Data

Jan. 30, 2002 (EP) ............................................. 02002308

(51) Int. Cl.[7] .............................. G01L 3/26; G01L 5/13; G01L 15/00
(52) U.S. Cl. ........................................................ 73/116
(58) Field of Search .......................... 73/116; 702/189, 702/151, 153; 341/116; 324/76.11; 710/22; 318/605, 254, 801; 280/93.5

(56) References Cited

U.S. PATENT DOCUMENTS

| 3,749,893 | A | | 7/1973 | Hileman |
| 4,079,374 | A | * | 3/1978 | Cox, Jr. ....................... 341/116 |
| 4,864,284 | A | | 9/1989 | Crayton et al. |
| 5,189,353 | A | * | 2/1993 | Ezuka .......................... 318/605 |
| 5,684,719 | A | | 11/1997 | Anagnost |
| 5,760,562 | A | | 6/1998 | Woodland et al. |
| 6,084,376 | A | | 7/2000 | Piedl et al. |
| 6,373,219 | B1 | * | 4/2002 | Obara et al. ................. 318/801 |
| 6,389,373 | B1 | * | 5/2002 | Ohya .......................... 702/189 |
| 6,554,303 | B2 | * | 4/2003 | Benz et al. ................. 280/93.5 |
| 6,719,089 | B2 | * | 4/2004 | Yoneda et al. ............... 180/446 |

FOREIGN PATENT DOCUMENTS

| DE | 100 57 674.5 | 5/2002 |
| EP | 1 065 135 A2 | 1/2001 |

OTHER PUBLICATIONS

"10-, 12-, 14-, or 16-Bit Industrial Resolver-to-Digital Converters" by DDC; c. 1985.

* cited by examiner

Primary Examiner—Eric S. McCall
Assistant Examiner—Octavia Davis
(74) Attorney, Agent, or Firm—Morrison & Foerster LLP

(57) ABSTRACT

Described are methods and devices for determining the rotary orientation of a motor using a resolver signal derived from the rotary orientation of the motor. In particular, the methods and devices utilize a single control system that is arranged both for triggering and for evaluating the resolver signal.

1 Claim, 7 Drawing Sheets

DEVICE AND METHOD FOR DETERMINING THE ROTARY ORIENTATION OF A MOTOR THROUGH USE OF A RESOLVER SIGNAL DERIVED FROM THE ROTARY ORIENTATION

CLAIM FOR PRIORITY

This application claims priority to European Application No. 02002308.1 which was filed in the English language on Jan. 30, 2002.

TECHNICAL FIELD OF THE INVENTION

A method and device for determining a rotary orientation of a motor, and in particular, through feeding a resolver signal derived from the rotary orientation to a single control system that is used for triggering and for evaluating the resolver signal, and a motor vehicle provided with such device.

BACKGROUND OF THE INVENTION

Patent Application DE 100 57 674.5 (corresponding to U.S. Ser. No. 10/004,297) assigned to the present assignee and herein incorporated by reference, relates to the determining of an actual steering angle through measuring the travel of a steering gear rack. The present invention envisages to be used in much more universal fields of application where often no such rack would be present, and furthermore, in particular to save appreciably on the costs of external electronic chips. Notably, earlier determinations of the orientation angle took place through using an external electronic facility, in the form of an integrated circuit chip.

SUMMARY OF THE INVENTION

The present invention provides a method using a resolver facility for generating sensing signals from the rotary orientation, which resolver facility feeds a single control facility both for triggering purposes and also for evaluating the resolver signals for subsequent use.

In one embodiment of the invention, there is a method for determining the rotary orientation of a motor through using a resolver signal derived from the rotary orientation. For many purposes, such determining should be accurate while furthermore necessitating an inexpensive set-up. A particular, but non-limiting field of application, is the motor vehicle industry, and in particular, applications with respect to the various motors such as used in the electrically assisted steering of the vehicle ("power steering"), the water cooling facility, climate control, anti-roll stabilization, choke control, and other secondary facilities such as the starter generator. In particular, the latter application would require a fine resolution because of its field-oriented control.

In one aspect of the invention, feeding such resolver signal exclusively to a single control system, that is furthermore arranged both for triggering and for evaluating the resolver signal.

In another embodiment according to the invention, the method is preferably characterized by mapping such control system on a micro-controller or digital signal processor.

According to still another embodiment of the invention, such method may advantageously be applied in a motor vehicle, and in particular to any one or more of an electrically assisted steering angle facility of such vehicle ("power steering"), a roll control facility, a fluid cooling facility, a climate control facility, a motor choke facility (150) and/or a vehicle starter generator facility.

In another embodiment of the invention, there is a device for determining a rotary orientation of a motor, the device having a resolver facility with a resolver signal output for outputting a signal derived from the rotary orientation. According to the invention, such device is characterized by a feeding connection for feeding such resolver signal exclusively to a single control system the control system having a trigger output for triggering and an evaluating input for receiving an evaluation signal for evaluating the resolver signal.

In another embodiment of such a device according to the invention, the system comprises a microcontroller or digital signal processor (hereinafter microcontroller) receiving at least two output signals from the resolver facility in parallel and having a single output for presenting the trigger signal to the resolver.

Alternatively, the device is characterized by the microcontroller having an Analog-to-Digital converter fed by the two output signals.

According to still another embodiment of the invention, such a device is preferably characterized in that the evaluating facility for the resolver signals has a tracking facility.

An embodiment of the device according to the invention is characterized in that the microcontroller has a clock generating unit feeding a timer unit that generates the microcontroller output signal, the clock generating unit and timer unit furthermore together feeding the Analog to Digital Converter.

Another embodiment of the device according to the invention is characterized in that the microcontroller has a clock generating unit feeding a Pulse Width Modulation Unit that generates the microcontroller output signal, the clock generating unit and Pulse Width Modulation unit furthermore together feeding the Analog to Digital Converter.

Yet another embodiment of the device according to the invention is characterized in that the microcontroller has a clock generating unit feeding a Digital to Analog Converter, that generates the microcontroller output signal, the clock generating unit furthermore feeding the Analog to Digital Converter.

In the above embodiments of the invention the clock generating unit uses a phase locked loop (PLL).

The invention, in a preferred embodiment, is characterized by an evaluating unit for evaluating the resolver output signals through executing a tracking procedure.

The tracking procedure is preferably based on:

$$F(s)=\Phi(s)/\phi(s)=K_1*(1+K_2*s)/(s^2+K_1*K_2*s+K_1),$$

wherein $\Phi$ is the estimated rotor angle, $\phi$ is the actual rotor angle, K1 and K2 are filter parameters and s is the complex frequency.

An embodiment of the device according to the invention is characterized by the microcontroller being furthermore provided with a phase shift compensating facility for effecting compensating for a phase shift of the resolver output signals.

According to still another embodiment, the above Analog to Digital converter is arranged for operating as a parallel scan facility with respect to the resolver output signals.

The Analog to Digital converter is preferably arranged to execute differential processing with respect to the resolver output signals as a correction measure for having interference signals on the respective signal interconnections canceling out.

The invention furthermore relates to a motor vehicle provided with such device.

BRIEF DESCRIPTION OF THE INVENTION

These and further aspects and advantages of the invention will be discussed more in detail hereinafter with reference to the disclosure of preferred embodiments, and in particular with reference to the appended Figures that show:

DETAILED DESCRIPTION OF THE INVENTION

Figure 1:
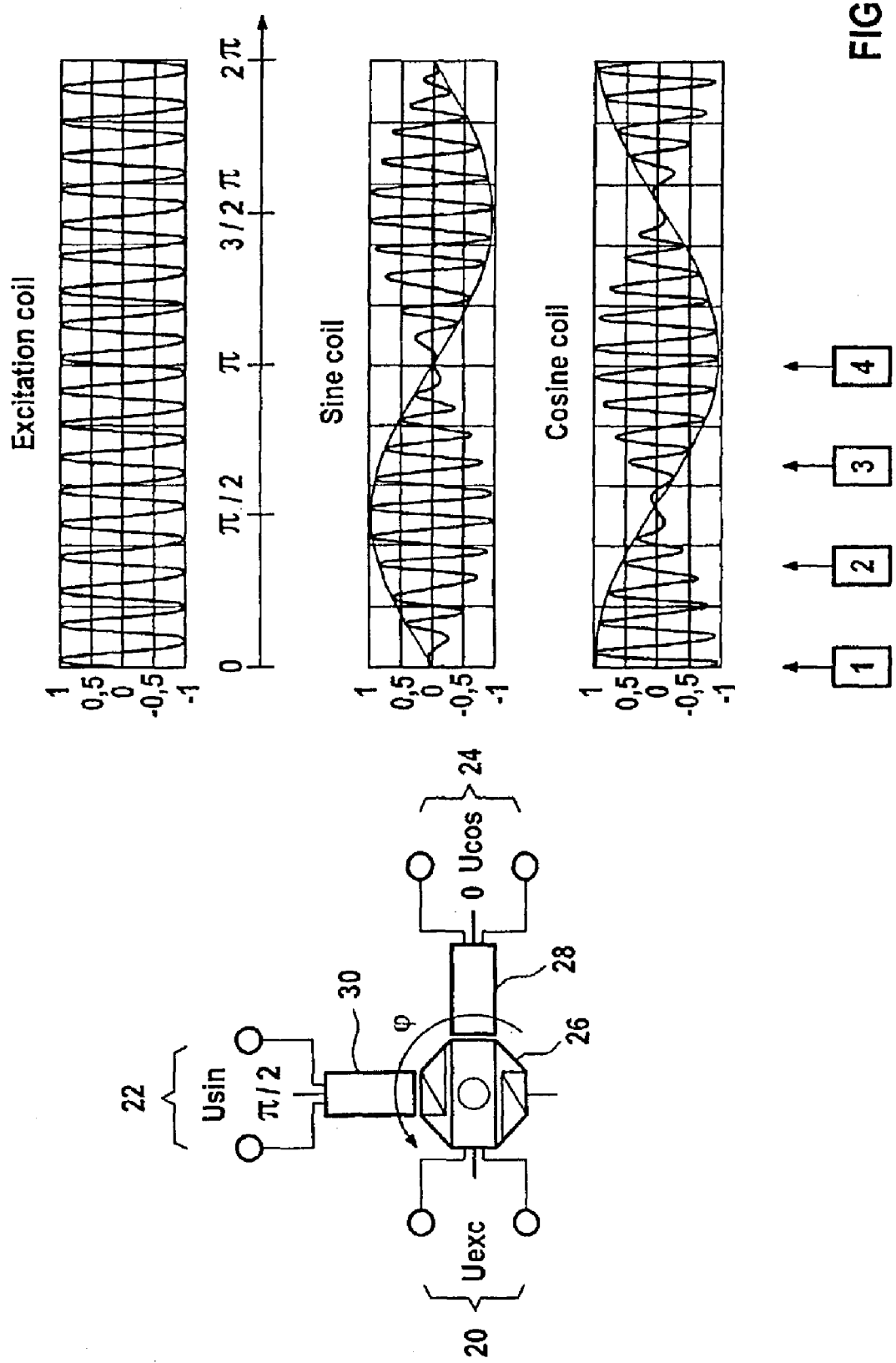
FIG. 1 is a diagram of a resolver facility.

FIG. 1 illustrates a functionality diagram of a resolver facility. Such resolvers have been in use where the rotor orientation of an electric driving motor must be monitored with high resolution and accuracy. By itself, such resolver can be considered as a self-rotating transformer. The required input signal is a sinusoid, and the two parallel output signals are amplitude modulated signals that for an orthogonal construction are designated as sinusoid and cosinusoid, respectively. In principle, other orientations could be feasible, as well as the use of more than two output sensing coils. The input signal for the resolver, as well as the output signals therefrom, are processed in electric driving systems through analog or digital evaluating devices, such as building block AS2S1000, manufactured by Analog Devices, Inc. According to the present invention, the input signals to the resolver, as well as the output signals from the resolver, are exclusively processed through a Digital Signal Processor DSP, or microcontroller. In particular, the evaluation uses the so-called tracking methodology.

In FIG. 1, the resolver shown can be used for monitoring both the angular position $\phi$ as well as the angular velocity $d\phi/dt$. As shown, the main sensing elements are the sensing coils 28, 30 that are positioned circularly in radial orientation around the rotating part 26. The central rotating part 26 is fixed to the rotating axis and constitutes a coupling element between excitation on terminals 20 and the sensing coils 28, 30. At right in the Figure, the excitation signal at the top will induce the modulated signals in the sine and cosine coil, that have amplitudes with sinusoidal and cosinusoidal variation, respectively. The envelope of the two signals has a substantially 100% modulation depth. The rotating part may be executed in the form of the primary coil as shown. Another implementation has a stationary inductive coil, whereas the rotary part would then constitute an inductive coupler with an angularly variable coupling factor.

Figure 2:
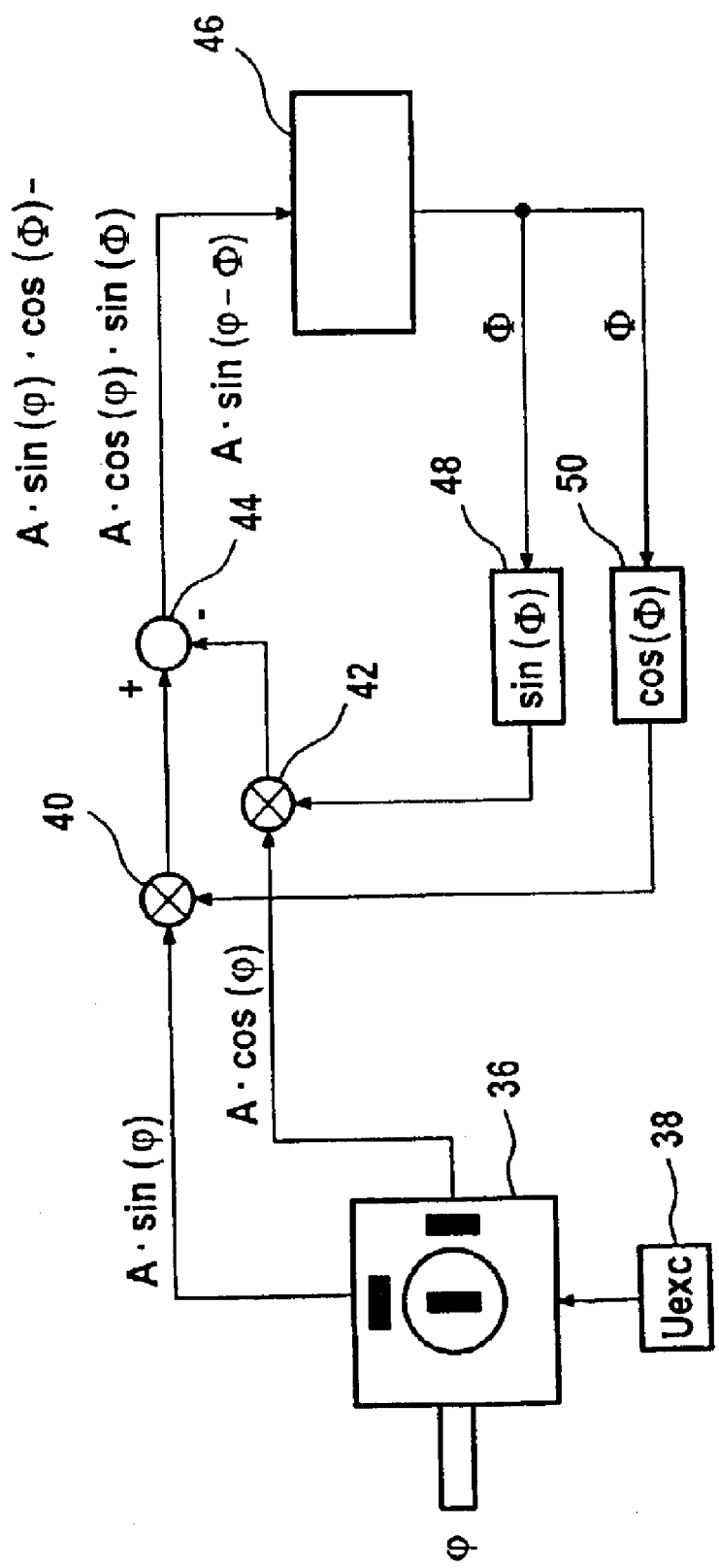
FIG. 2 shows evaluation of the resolver output signals according to a first principle.

FIG. 2 illustrates the evaluating of the resolver output signal according to the tracking (German: Nachlauf) principle. The resolver facility 36 with excitation facility 38 and the instantaneous angular position $\phi$ have been clearly shown. As shown, the resolver outputs are A sin($\phi$) and A cos($\phi$) that feed multipliers 40 and 42. The outputs A sin($\phi$) and A cos($\phi$) are obtained from the modulated resolver signals A sin($\omega t$)*sin($\phi$) and A sin($\omega t$)*sin($\phi$) by sampling this signals exactly at the maximum or minimum of the carrier signal A sin($\omega t$) where $\omega$ is the circular frequency of this signal and t is the time. Subtracting the two products A sin($\phi$) and A cos($\phi$) in subtractor 44 followed by standard calculation steps yields the input to angle monitor 46, that furthermore by means of function generators 48, 50 outputs two quantities sin($\Phi$) and cos($\Phi$), respectively, for feeding the two multipliers 40 and 42. The sinusoidal excitation voltage is presented:

$$U_{exc} = \hat{U}*\sin(\omega t + \delta_{res}),$$

wherein the successive quantities are the excitation voltage, the excitation amplitude, the circular frequency of the excitation signal, the time, and a phase shift angle. The latter is a property of the geometrical realization.

In the calculation, $\Phi$ is an estimated rotational angle, so that ($\phi - \Phi$) is the deviation, that must be controlled towards a zero value. Herein, sin($\phi - \Phi$) is approximated by ($\phi - \Phi$) for small values of the difference ($\phi - \Phi$).

Figure 3:
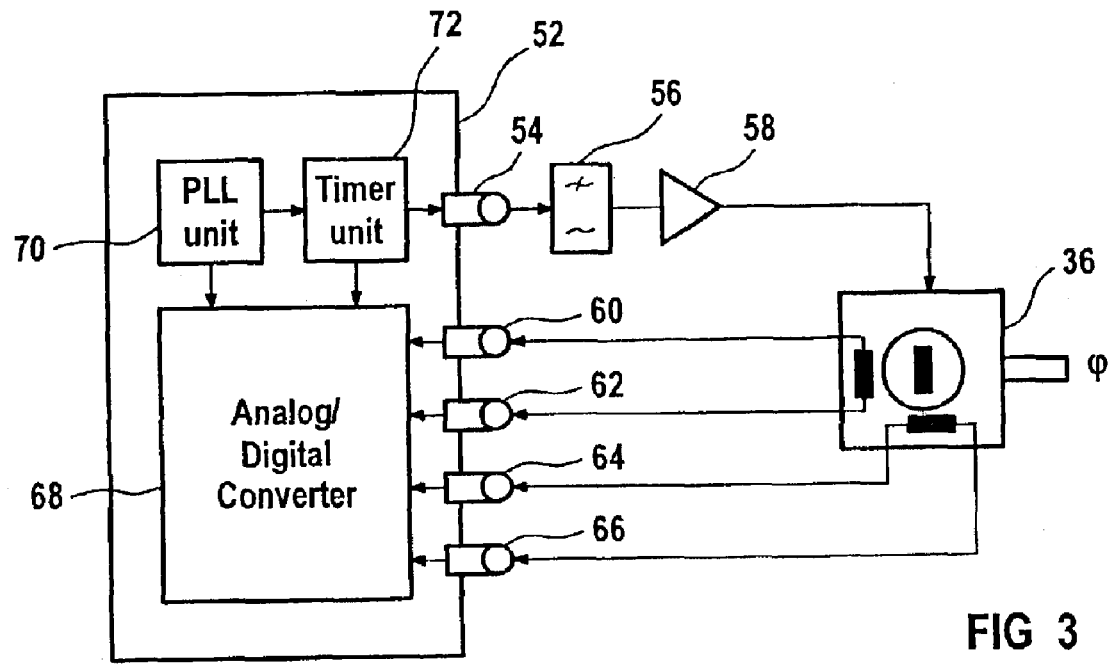
FIG. 3 shows signal generation in a microcontroller that is provided with a timer unit.

FIG. 3 illustrates a signal generation embodiment through using a microcontroller 52 that is provided with a timer unit 72 and an Analog to Digital converter 68. Resolver 36 has two output connection pairs 60/62 and 64/66 for the two output signals that feed an Analog to Digital Converter 68. An internal counter not separately shown in the timer module 72, fed by a clock generating unit 70, which use a Phase Locked Loop, is used as frequency divider and generates from the internal microcontroller bus clock a two-valued block signal with a duty cycle of 50% and a frequency that is appropriate for the excitation. In a low-pass filter 56, which is connected to the output pin 54 of the timer unit 72, the basis frequency wave is filtered out from the two-valued signal and applied at low output impedance through buffer or amplifier 58 to the excitation coil of resolver 36. The filtering will cause a certain phase delay. This will likewise cause a phase shift in the secondary output signals to microcontroller 52.

The microcontroller 52 can be a conventional building block featuring a processor, program ROM, data RAM, memory management, interconnection among these items, and an external communication facility. Various other features could be present in addition, and persons skilled in the art would know how to choose among such commercially available products in view of temporal and spatial resolution of the angles that would be necessary, and possibly, in view of other tasks that the device in question should execute. Also, the programming of the microcontroller would by itself straightforward. Alternatively, an also commercially available building block Digital Signal Processor could be used in lieu of the microcontroller. For brevity and convenience, hereinafter the description refers to a microcontroller, which referring should include also a Digital Signal Processor.

Figure 4:
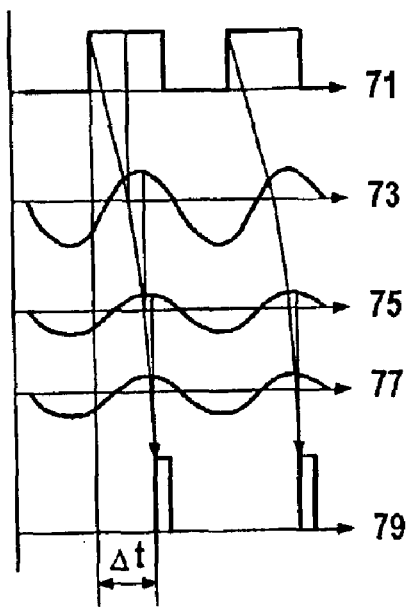
FIG. 4 shows output signals from the timer module and from the resolver.

FIG. 4 illustrates output signals from the timer module and the resolver shown in FIG. 3. To compensate for the phase delay, a further counter of the timer module, not shown for brevity, is driven as a monostable flipflop with a delayed trigger, of which the delay can be adjusted. The rising signal edge is used for controlling the Analog to Digital Converter. This emphasizes the necessity for using a microcontroller that has an Analog to Digital Converter which can be triggered by the timer module 72. The pulse length of the Monoflop output is irrelevant but should lie in an interval corresponding to the requirements posed by the microcontroller. The sensing of the resolver signals at the maximum value is necessary for demodulating the signal in question. Therefore, the Analog to Digital Converter produces immediately the demodulated signals sin($\phi$) and cos ($\phi$), respectively. The successive curves in FIG. 4 represent the signal at the output pin of the timer module (71), the signal at the input of the resolver (73), the signal at the sine output of the resolver (75), the signal at the cosine output of the resolver (77), and the signal at the sync-input of the AD converter (79).

Figure 5:
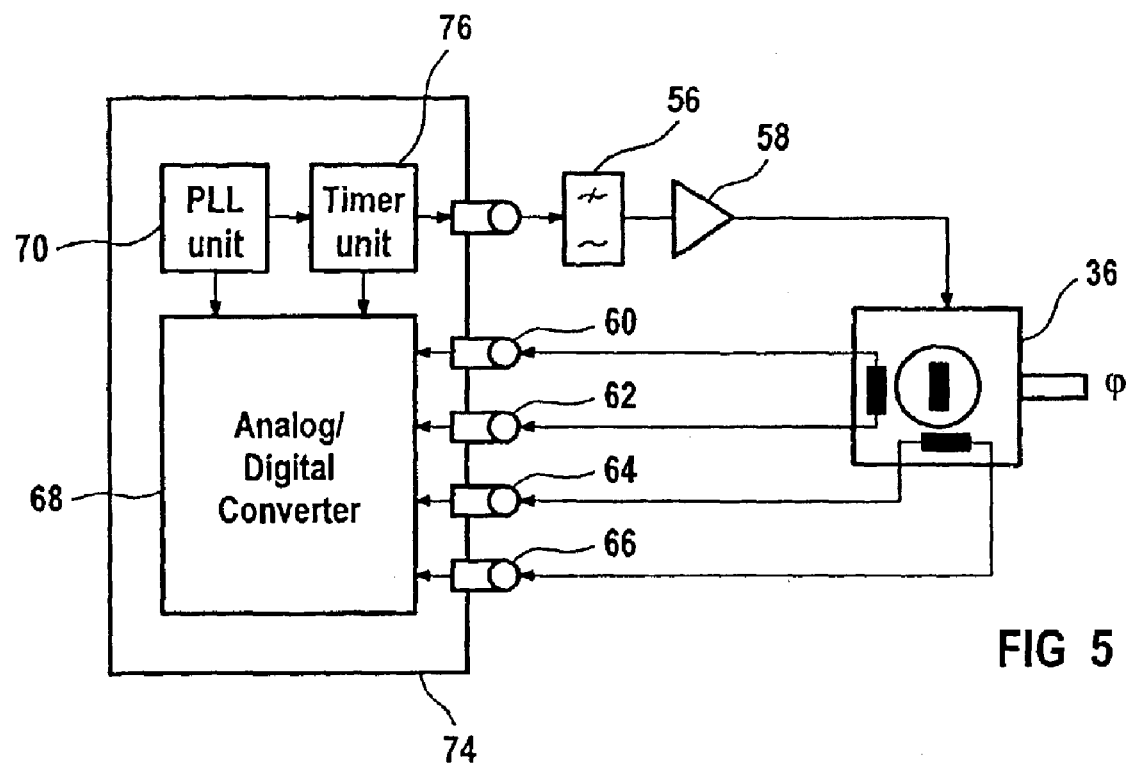
FIG. 5 shows signal generation in a microcontroller that has a pulse width modulation unit.

FIG. 5 illustrates signal generation in a microcontroller 74 that has PLL unit 70 and a Pulse Width Modulation unit 76, corresponding elements carrying the same reference numerals as in FIG. 3. Through the PWM unit 76, indirectly a sinusoidal voltage is modulated. The pulse width of the PWM signal changes along with the amplitude of the excitation signal to be generated. On the one hand, a somewhat greater amount of calculation is necessary in microcontroller 74. On the other hand, the requirements to analog low-pass filter 56 are less than before. In this embodiment, the microcontroller 74 will advantageously offer trigger signals to the Analog to Digital converter through the PWM module 76.

Figure 6:
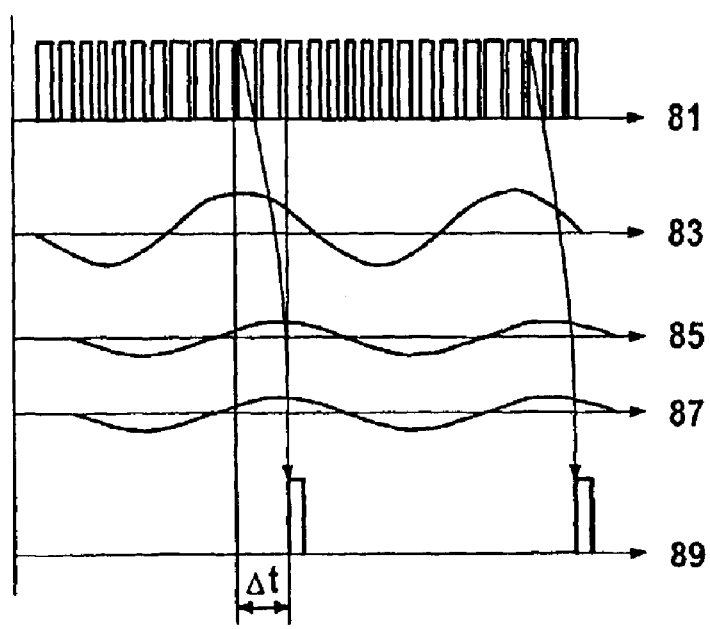
FIG. 6 shows output signals from the pulse width modulation unit and from the resolver.

FIG. 6 illustrates the output signals from the pulse width modulation and the resolver. The delay in converting the input signals with respect to the generating of the excitation frequency is also brought about by the PWM module. The conversion is started upon attaining a prespecified number of n pulses after arriving at the maximum. This demodulates the resolver signal. The successive curves in FIG. 6 represent the signal at the output pin of the PWM module (81), the signal at the input of the resolver (83), the signal at the sine output of the resolver (85), the signal at the cosine output of the resolver (87), and the signal at the sync-input of the AD converter (89).

Figure 7:
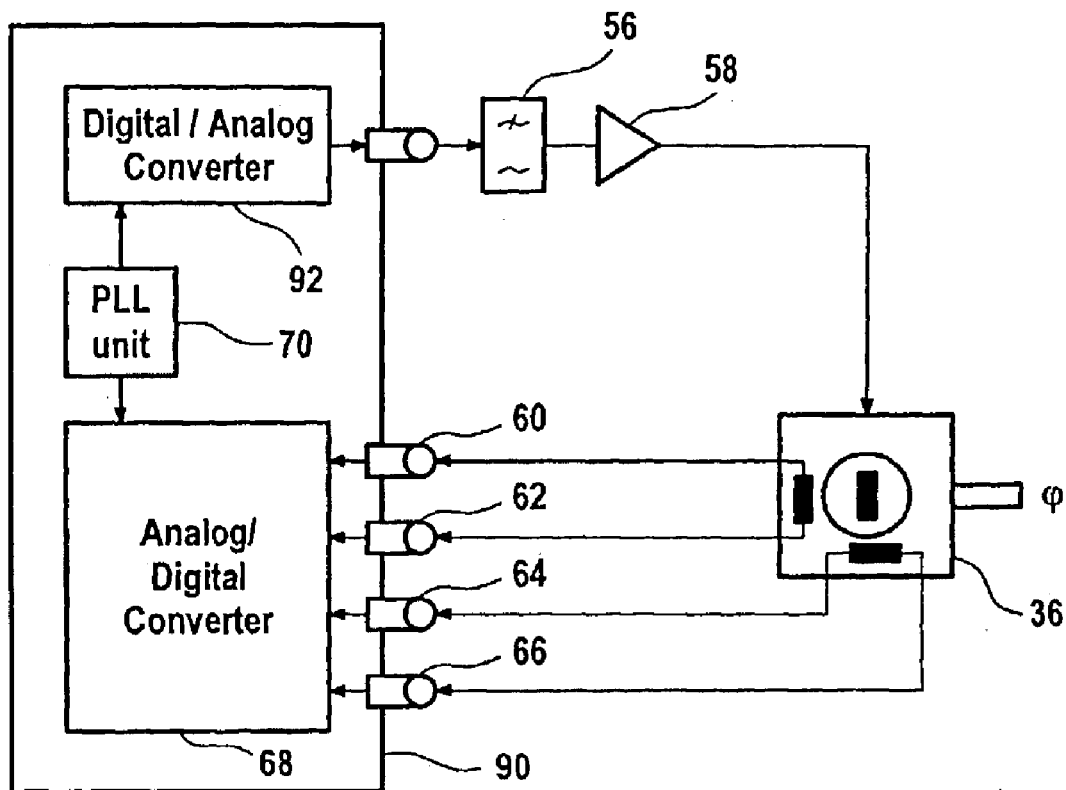
FIG. 7 shows signal generation in a microcontroller that has a digital to analog converter.

FIG. 7 illustrates the signal generation in a microcontroller 90 that has a Digital to Analog converter 92, in addition to various elements corresponding to those of FIG. 5 and carrying the same reference numerals. The excitation voltage is outputted directly via the Digital to Analog Converter. This will furthermore decrease the requirements to the filtering of the signals in filter 56. The microcontroller software must provide for starting the generation of the excitation voltage through the Digital to Analog Converter and the converting of the operation of the Analog to Digital Converter proper.

Figure 8:
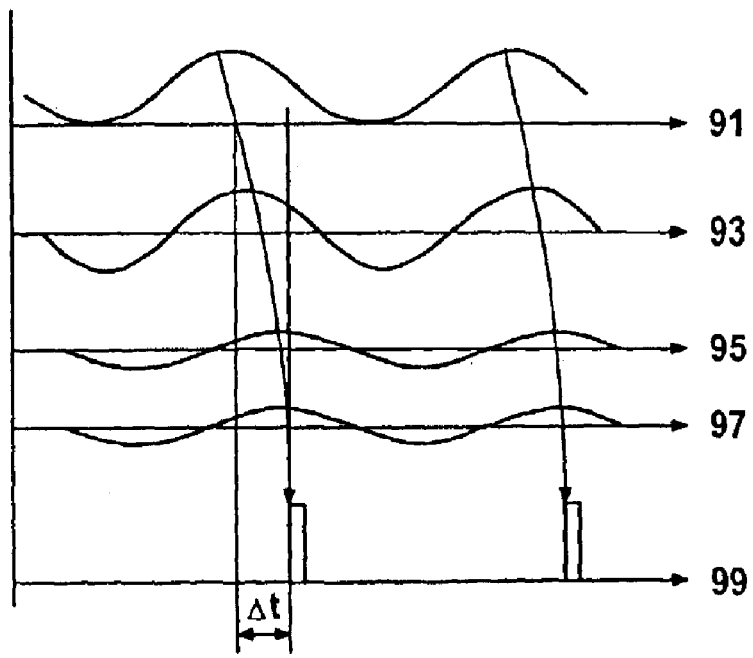
FIG. 8 shows output signals from the digital to analog converter and from the resolver.

FIG. 8 illustrates output signals from the digital analog converter 92 and the resolver 36. The successive curves in this Figure represent the signal at the output pin of the Digital to Analog Converter (91), the signal at the input of the resolver (93), the signal at the sine output of the resolver (95), the signal at the cosine output of the resolver (97), and the signal at the sync-input of the AD converter (99). The respective delays eventually result in a value At as shown.

Either under control of a SYNC signal, or through a software activation, the Analog to Digital Converter will repeatedly start a next Analog Conversion Scan. If the Analog Digital Conversion allows parallel scanning of four input signals, the resolver signals may be read in a differential manner. The simultaneous reading of two input signals should be guaranteed as being correct at higher resolver frequencies relative to the clock frequency of the microcontroller. Otherwise, the parallel operation could cause angle errors that were variable with angular velocity.

Differential transfer of secondary resolver signals to the Analog to Digital Converter would to an appreciable degree compensate for interference signals on the signal interconnections, because these signals would be coupled to the twisted connections with an identical phase, and so largely cancel out.

Through sensing the Sine and Cosine resolver output signals at their maximum points, the signal will be demodulated. This immediately yields the signals $\sin(\phi)$ and $\cos(\phi)$, according to the following expressions:

$$\hat{U}*\sin(\omega*t+\delta_{res})*\sin(\phi)\text{-demodulation}\rightarrow A*\sin(\phi)$$

$$\hat{U}*\sin(\omega*t+\delta_{res})*\cos(\phi)\text{-demodulation}\rightarrow A*\cos(\phi)$$

Herein, $\hat{U}$ is the amplitude of the excitation signal, $\omega$ is the circular frequency of the excitation signal, t is the time, $\delta_{res}$ is the angular phase shift and $\phi$ is the actual rotor angle.

Figure 9:
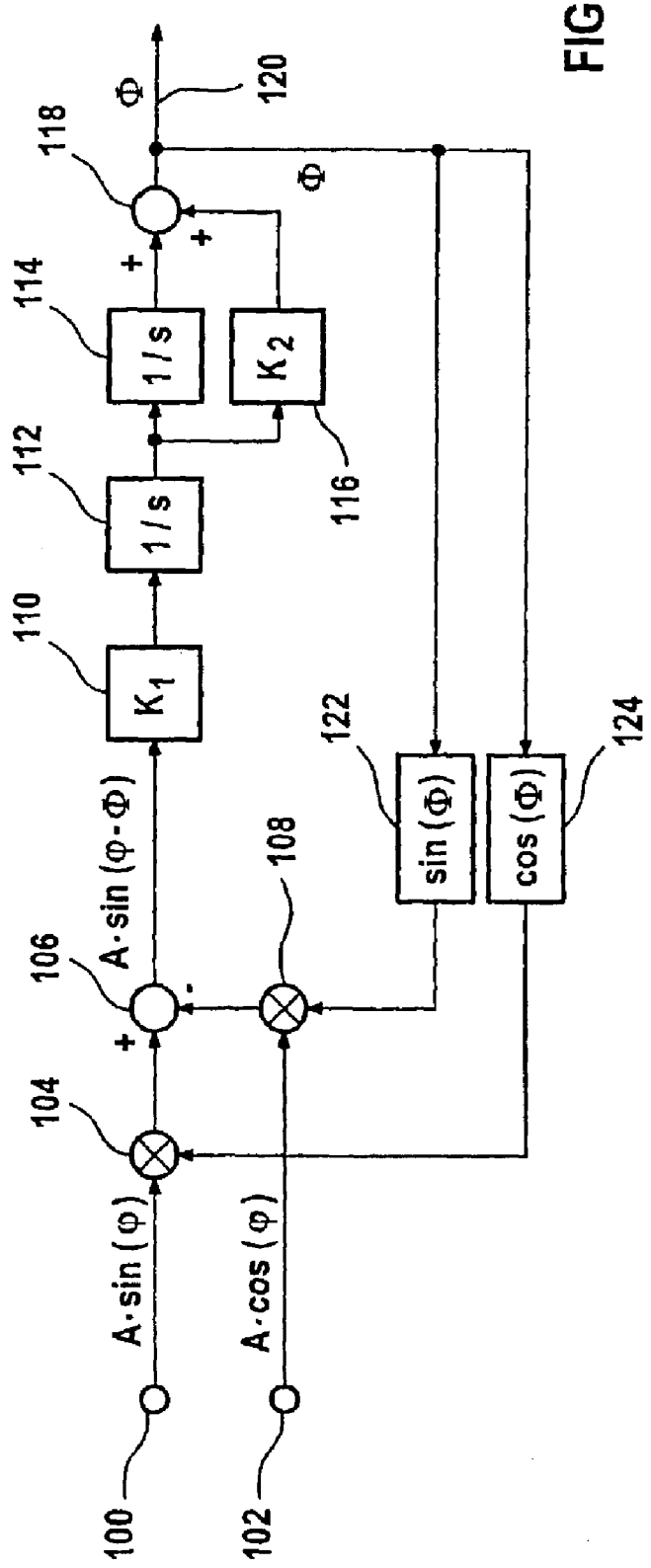
FIG. 9 shows an angle monitoring.

FIG. 9 illustrates a functionality diagram of the angle monitoring. Inputs 100, 102 receive the two resolver signals. Various processing elements are multipliers 104, 108, subtractor 106, adder 118, the proportional amplifier with amplification $K_1$ 110 and $K_2$ 116, the integrators 112 and 114, and the generating of the sine and cosine functions, respectively of the estimated angle Φ, 122, 124. The principal functions are thereby those of an integrator and of a PI controller. This setup strives to adjust the discrepancy between actual rotor angle φ and the estimated (by the angle monitoring control loop in FIG. 9) angle Φ to zero. The transfer function is as follows:

$$F(s)=\Phi(s)/\phi(s)=K_1*(1+K_2*s)/(s^2+K_1*K_2*s+K_1),$$

wherein the various parameters have been indicated supra. The parameters can be set according to the particular system constants. Advantageously, the monitoring will be executed completely in software on the microcontroller.

Figure 10:
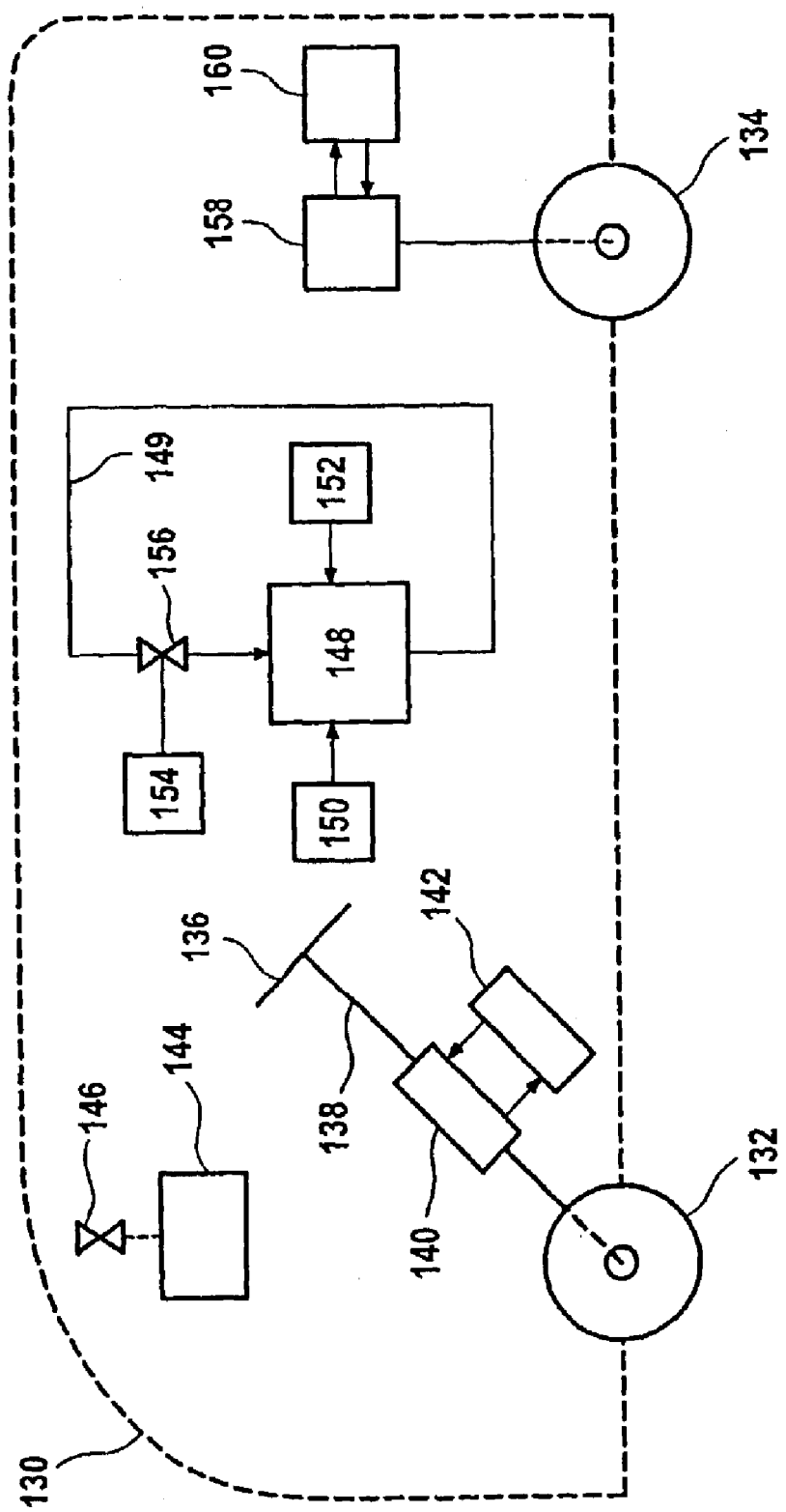
FIG. 10 shows a motor vehicle provided with various subsystems embodying the invention.

FIG. 10 illustrates a motor vehicle provided with various subsystems each embodying the invention. The vehicle has succinctly been indicated by the vehicle body 130, front (132) and rear wheels (134), main engine 148, and steering wheel 136. Most of the remaining constructions and facilities have been omitted for brevity; inasmuch as by themselves, persons skilled in motor vehicle art and various subfields thereof would know how to design such conventional facilities.

Steering wheel column 138 has been provided with an electric motor 140 for implementing so-called "power steering", to thereby diminishing the necessary exertions by a driving person. The rotary angle and/or angular velocity of the steering column are evaluated in a control device 142 according to the invention, for as based thereon generating control signals to drive motor 140.

Main engine 148 during operation is being cooled by a coolant loop 149. For optimum fuel efficiency, the coolant stream is controlled by a valve 156, that itself is driven by a rotary motor 154. In similar manner as regards motor 140, the position of motor 154 is evaluated by a device according to the present invention for so effecting further control such as feed-back operations, not shown for clarity.

For reasons of anti-roll stabilization, rear wheel(s) 134 have been provided with a suspension facility 158 and including parts thereof that may have their operating parameters such as stiffness or bias position controlled by a rotary motor, or by another device that ultimately effects a rotary motion. Through element 160, such rotary position and/or temporal differentials thereof are sensed by device 160 according to the present invention, whereupon the measured parameter values can be used for controlling the above operational parameters.

Further subsystems that may have a device installed according the present invention, but which have for reasons of brevity been shown in no more than blockwise representations are the following. Climate control 144 uses a valve 146 for regulating various air currents and/or air temperatures. The rotary motor that drives valve 146 may have been provided with the facilities according to the present invention. Choke control facility 150 in its turn may have a valve or other parts that have their positions controlled by a rotary motor and including a facility embodying the present invention. Starter generator 152 in its turn may have a valve or other parts that have their positions controlled by a rotary motor and including a facility embodying the present invention.

In the above, the present invention has been disclosed by reference to various preferred embodiments. Nevertheless, persons skilled in the art would from reading the disclosure recognized various changes and modifications. Therefore, the description should be taken by way of instruction rather than by way of limitation.

What is claimed is:

1. A device for determining a rotary orientation of a motor, comprising:
- a resolver facility with a resolver signal output for outputting a signal derived from the rotary orientation;
- a feeding connection to feed the resolver signal to a single control system, the control system having a trigger output to trigger and an evaluating input to receive an evaluation signal for evaluating the resolver signal;
- a microcontroller or digital signal processor receiving at least two output signals from the resolver facility in parallel and having a single output to present the trigger signal to the resolver; and
- an evaluating unit to evaluate the resolver output signals through executing a tracking procedure, wherein the tracking procedure is based on:

$$F(s)=\Phi(s)/\phi(s)=K_1*(1+K_2*s)/(s^2+K_1*K_2*s+K_1),$$

wherein $\Phi$ is the estimated rotor angle, $\phi$ is the actual rotor angle, K1 and K2 are filter parameters and s is a complex frequency.

* * * * *